(12) United States Patent
Harada et al.

(10) Patent No.: US 11,101,414 B2
(45) Date of Patent: Aug. 24, 2021

(54) METHOD FOR MANUFACTURING WAVELENGTH CONVERSION MEMBER, AND METHOD FOR MANUFACTURING LIGHT EMITTING DEVICE

(71) Applicant: NICHIA CORPORATION, Anan (JP)

(72) Inventors: Yuji Harada, Anan (JP); Takanori Akaishi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/699,102

(22) Filed: Nov. 28, 2019

(65) Prior Publication Data

US 2020/0176645 A1 Jun. 4, 2020

(30) Foreign Application Priority Data

Nov. 30, 2018 (JP) .............................. JP2018-224764

(51) Int. Cl.
*H01L 33/50* (2010.01)
*H01L 33/00* (2010.01)

(52) U.S. Cl.
CPC .......... *H01L 33/502* (2013.01); *H01L 33/005* (2013.01); *H01L 2933/0041* (2013.01)

(58) Field of Classification Search
CPC ..................................................... H01L 33/502
See application file for complete search history.

(56) References Cited

U.S. PATENT DOCUMENTS

| 2005/0040765 | A1* | 2/2005 | Okumura ........... C09K 11/7734 |
| | | | 313/582 |
| 2011/0018026 | A1* | 1/2011 | Konno .................... H01L 33/50 |
| | | | 257/100 |
| 2016/0072026 | A1 | 3/2016 | Kanaumi |
| 2016/0097495 | A1 | 4/2016 | Yamamoto et al. |

FOREIGN PATENT DOCUMENTS

| JP | 2006100730 A | 4/2006 |
| JP | 2010275334 A | 12/2010 |
| JP | 2014056896 A | 3/2014 |
| JP | 2015063619 A | 4/2015 |
| JP | 2016076699 A | 5/2016 |
| JP | 2016098244 A | 5/2016 |
| WO | 2016075750 A1 | 5/2016 |

* cited by examiner

*Primary Examiner* — William A Harriston
(74) *Attorney, Agent, or Firm* — Global IP Counselors, LLP

(57) ABSTRACT

A method for manufacturing a wavelength conversion member includes: irradiating plasma on surfaces of phosphor particles; mixing the phosphor particles irradiated by plasma and a liquid form resin member to form a slurry; and curing the slurry.

13 Claims, 9 Drawing Sheets

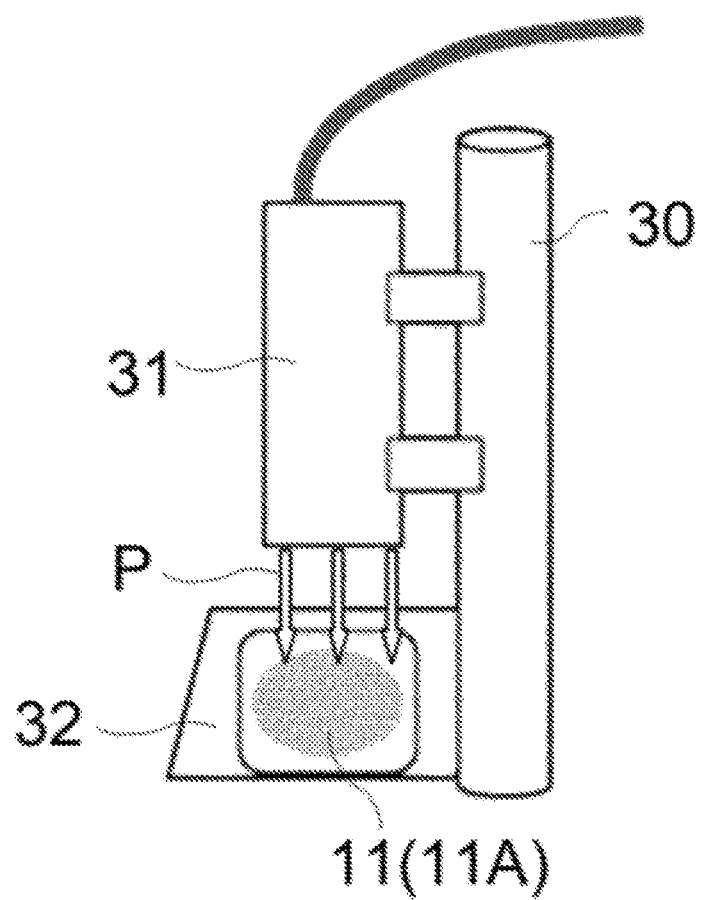

METHOD FOR MANUFACTURING WAVELENGTH CONVERSION MEMBER, AND METHOD FOR MANUFACTURING LIGHT EMITTING DEVICE

CROSS-REFERENCE TO RELATED APPLICATIONS

This application claims priority to Japanese Patent Application No. 2018-224764, filed on Nov. 30, 2018. The entire disclosure of Japanese Patent Application No. 2018-224764 is hereby incorporated herein by reference.

TECHNICAL FIELD

The present disclosure relates to a method for manufacturing a wavelength conversion member, and a method for manufacturing a light emitting device.

BACKGROUND ART

Light emitting devices are known that comprise a wavelength conversion member for which phosphor is mixed in a resin, and a semiconductor light emitting element (hereafter noted as "light emitting element"). The wavelength conversion member is obtained by mixing a particle form phosphor in a liquid form resin material and curing the obtained mixed liquid (as in Japanese Laid-Open Patent Application Publication No. 2014-056896 and Japanese Laid-Open Patent Application Publication No. 2015-063619, for example).

SUMMARY

With a wavelength conversion member that contains a resin material, by curing, mainly the volume of resin material decreases. However, depending on the type of resin material or the type of phosphor, there are cases when the reduction rate of the volume of the wavelength conversion member is great.

The present disclosure includes the following configuration.

A method for manufacturing a wavelength conversion member includes: irradiating plasma on surfaces of phosphor particles; mixing the phosphor particles irradiated by plasma and a liquid form resin member to form a slurry; and curing the slurry.

Using the method for manufacturing a wavelength conversion member shown above, it is possible to make the volume change rate of the wavelength conversion member smaller.

BRIEF DESCRIPTION OF THE DRAWINGS

FIG. 3 is a schematic diagram showing the method for manufacturing a wavelength conversion member of embodiment 1.

DETAILED DESCRIPTION OF EMBODIMENTS

Modes for carrying out the present invention are explained while referring to drawings hereafter. However, the modes shown below show examples of the method for manufacturing a light emitting device for realizing the technical concept of the present invention, and the present invention does not limit the method for manufacturing a light emitting device to the following.

Also, this specification by no means specifies members shown in the scope of patent claims to be members of the embodiments shown hereafter. In particular, unless specifically noted, the dimensions, material, shape, relative placement, etc., of the constituent parts noted in the embodiments are not intended to limit the scope of patent claims only thereto. Moreover, the size, positional relationship, etc., of the members shown in each drawing may be exaggerated to make the explanation clearer.

Furthermore, in the explanation hereafter, the same names and codes indicate the same or similar members, and a detailed explanation will be omitted as appropriate.

The method for manufacturing a wavelength conversion member or the method for manufacturing a light emitting device of this embodiment comprises a step for irradiating plasma on the surface of a particle form phosphor (phosphor particles) contained in the wavelength conversion member. As a result, it is possible to reform the surfaces of the phosphor particles, and possible to improve the wettability of the phosphor and the resin material. For that reason, even in a case of using a phosphor with low wettability with the resin material, it is possible to reduce the volume reduction rate of the wavelength conversion member.

Embodiment 1

Figure 1:
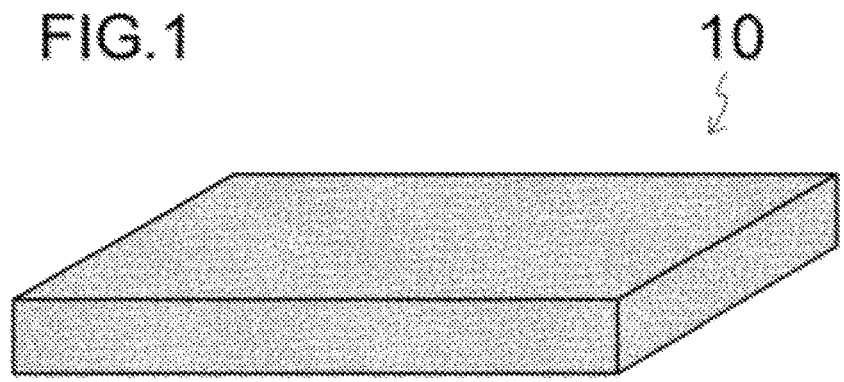
FIG. 1 is a schematic diagram of a wavelength conversion member obtained with a method for manufacturing a wavelength conversion member of embodiment 1.

FIG. 1 is a schematic diagram showing an example of a wavelength conversion member 10 obtained using the method for manufacturing a wavelength conversion member of embodiment 1. The wavelength conversion member 10 contains a resin member 12 and a phosphor 11 (phosphor particles).

This kind of wavelength conversion member 10 can be obtained by the following steps. More specifically, comprised are: a step for irradiating plasma on the surfaces of phosphor particles 11A (phosphor before plasma irradiation); a step for mixing the phosphor particles 11 irradiated with plasma and the liquid form resin member 12, and forming a slurry 10A; and a step for curing the slurry 10A.
(Step for Irradiating Plasma on the Surface of Phosphor)

First, the particle form phosphor 11A (phosphor before plasma irradiation) is prepared. For example, the phosphor 11A (before the plasma treatment), and the phosphor 11 (after the plasma treatment) are able to absorb light of ultraviolet to green wavelengths, and convert that light to light of a different wavelength.

The phosphor 11A is in particle form, and is a sphere, a cube, a rectangular solid, an irregular shape comprising recessions and projections on the surface, etc. The average particle size of the phosphor 11A is not particularly restricted, but it is possible to use particles of approximately 0.1 μm to 100 μm, for example. For the average particle size of the phosphor 11A, from the perspective of ease of handling, it is possible to use particles preferably of 1 μm to 50 μm, and more preferably 2 μm to 30 μm.

The value of the average particle size (D bar) is according to the air permeability method or the F.S.S.S. No. (Fisher-SubSieve-Sizers-No.). Also, the phosphor 11A before plasma irradiation and the phosphor 11 after plasma irradiation are only different in terms of surface characteristics, and there is no change in average particle size, light emission wavelength, etc., before and after plasma irradiation.

Figure 2A:
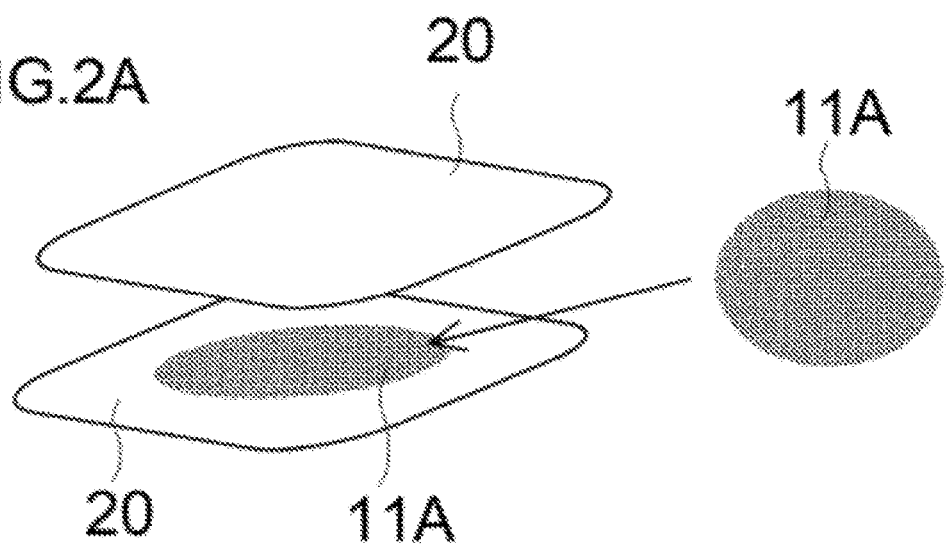
FIG. 2A is a schematic diagram showing the method for manufacturing a wavelength conversion member of embodiment 1.
Figure 2B:
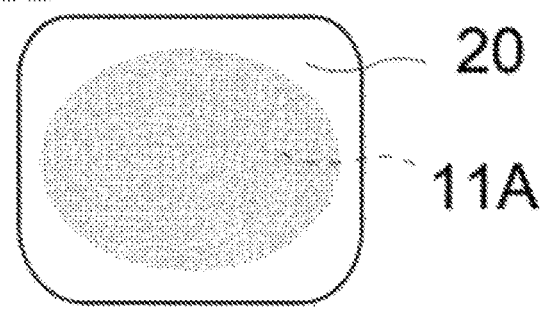
FIG. 2B is a schematic diagram showing the method for manufacturing a wavelength conversion member of embodiment 1.

The particles of the phosphor 11A are held by a holding member 20 such as shown in FIG. 2A, for example, so as not to be scattered by wind, vibration, etc. The holding member 20 is irradiated by plasma together with the held phosphor 11A, so it is preferable to use a material that is excellent in terms of weather resistance, heat resistance, etc. Examples include Teflon (registered trademark), ETFE, FEP, etc.

For the shape of the holding member 20, it is possible to use a bag shape, or a box shape, for example. Also, the size of the holding member 20 is sufficient provided it has the capacity to be able to house the desired amount of the phosphor 11A. For the holding member 20, a member for which at least a portion can transmit the plasma described later is used. For example, it is possible to use the holding member 20 for which at least a portion comprises a filter defining the openings smaller than the average particle size of the phosphor 11A. For example, as shown in FIG. 2A, it is possible to use a bag shaped holding member that sandwiches and seals the phosphor 11A between sheet form filters (holding members) 20. As a result, the holding member 20 comprises a filter with smaller openings than the average particle size of the phosphor 11A.

As phosphors that emit green light, examples include yttrium aluminum garnet (YAG) type phosphor ($Y_3(Al, Ga)_5O_{12}$: Ce, for example), lutetium aluminum garnet (LAG) type phosphor ($Lu_3(Al, Ga)_5O_{12}$: Ce, for example), terbium aluminum garnet type phosphor ($Tb_3(Al, Ga)_5O_{12}$: Ce) for example), silicate type phosphor (($Ba, Sr)_2SiO_4$: Eu, for example), chlorosilicate type phosphor ($Ca_8Mg(SiO_4)_4Cl_2$: Eu, for example), β sialon type phosphor ($Si_{6-z}Al_zO_zN_{8-z}$: Eu (0<z<4.2), for example), SGS type phosphor ($SrGa_2S_4$: Eu, for example), etc.

As phosphors that emit yellow light, examples include an α sialon type phosphor (for example, $M_z(Si, Al)_{12}(O, N)_{16}$ (where 0<z≤2, and M is Li, Mg, Ca, Y, and a lanthanide element excluding La and Ce)), etc. In addition, there are phosphors that emit yellow light among the phosphors that emit green light noted above.

For example, yttrium aluminum garnet type phosphor can shift the light emission peak wavelength to the long wavelength side by replacing a portion of the Y with Gd, so that yellow light emission is possible. Also, there are also phosphors among these that are capable of orange light emission.

As phosphors that emit red light, examples include nitrogen-containing calcium aluminosilicate (CASN or SCASN) type phosphor (($Sr, Ca) AlSiN_3$: Eu), for example), etc. In addition, examples include manganese-activated fluoride type phosphor (being a phosphor represented by general formula (I) $A_2[M_{1-a}Mn_aF_6]$ (where in general formula (I) noted above, A is at least one type selected from the group consisting of K, Li, Na, Rb, Cs, and $NH_4$, M is an element of at least one type selected from the group consisting of group 4 and group 14 elements, and a satisfies 0<a<0.2)), etc. As a representative example of this manganese-activated fluoride type phosphor, there is manganese-activated potassium fluorosilicate (KSF) phosphor ($K_2SiF_6$:Mn, for example).

Of the phosphors noted above, when not irradiating plasma, as a material with a large volume change of the wavelength conversion member, examples include KSF, YAG, LAG, etc. The wavelength conversion member using these phosphors, by using a phosphor for which plasma was irradiated, has a significant effect of reducing the volume reduction rate.
(Step for Irradiating Plasma on the Surface of the Phosphor)

Plasma is irradiated on the surfaces of the particles of the phosphor 11A. More specifically, plasma is irradiated in a state in which the phosphor 11A is housed within the holding member 20. As the device for irradiating plasma, an atmospheric pressure plasma processing device is prepared. FIG. 3 is a schematic diagram showing the main parts of an atmospheric pressure plasma processing device 31. The atmospheric pressure plasma processing device 31 comprises a support column 30, and a pedestal 32 on which to place samples. At least one of the atmospheric pressure plasma processing device 31 and the pedestal 32 can be movable. The atmospheric pressure plasma processing device 31 can be placed in a sealed space, or in an open space. As the plasma carrier gas, it is possible to use gases that are harmless to the human body such as air, nitrogen gas, etc. It is also possible to use fluorine-containing gases such as $CF_4$ and $CHF_3$.

The atmospheric pressure plasma processing device 31 is connected to a device called a generator, and the gas controlled by the generator is supplied to the interior of the atmospheric pressure plasma processing device 31. The atmospheric pressure plasma processing device 31 comprises a gas supply port through which gas controlled by generator is supplied; and a tip part (plasma irradiation port) for irradiating gas turned to plasma to outside. Furthermore, a plasma generating unit is provided on the inside of the atmospheric pressure plasma processing device 31. As shown in FIG. 3, after being exposed to plasma generated by the plasma generating unit, the gas supplied to the inside of the atmospheric pressure plasma processing device 31 is irradiated (plasma P irradiation) from the tip part of the atmospheric pressure plasma processing device 31 to outside as gas turned to plasma. The atmospheric pressure plasma processing device is not limited to a device having the above described structures, and commercially available atmospheric pressure plasma processing devices for treating powders/particles may be used as the atmospheric pressure plasma processing device 31.

The pedestal 32 is irradiated with plasma together with the sample placed thereon (the holding member 20 that houses the phosphor 11A). For that reason, it is preferable to use a material with excellent weather resistance, heat resistance, etc., for the pedestal 32. For example, it is possible to use stainless steel, etc., for the pedestal 32. The distance between the top surface of the pedestal 32 (sample placement surface) and the tip part of the atmospheric pressure plasma processing device 31 can be 10 mm to 100 mm, for example.

The holding member 20 that houses the phosphor 11A is placed on the pedestal 32, and the plasma P is irradiated from plasma nozzle 31. The applied voltage can be in the range of 250 V to 320 V, for example, and is preferably 280 V. The gas introduction amount can be in the range of 1 g/h to 80 g/h, and is preferably 10 g/h to 40 g/h.

The time for irradiating the plasma P can be 1 second to 100 seconds for one irradiation time, and this can be performed 1 to 3 times, for example. Also, when irradiating the plasma P with the phosphor 11A housed and in a flat state inside the bag shaped holding member 20 comprising a filter on the front surface and back surface like that shown in FIG. 2A, it is preferable to irradiate the plasma P from both surfaces. In other words, it is preferable to comprise a step for irradiating the plasma P from the front surface side of the holding member 20, and a step for irradiating the plasma P from the back surface side of the holding member 20. First, the plasma P is irradiated from above with the flat front surface of the holding member 20 upward as shown in FIG. 3. Then, the plasma P is irradiated from above with the back surface of the holding member 20 upward (turned over). By doing this, approximately the entirety of the overall surfaces of the particles of the phosphor 11A inside the holding member 20 can be irradiated with plasma.

(Step for Forming Slurry)

Figure 4A:
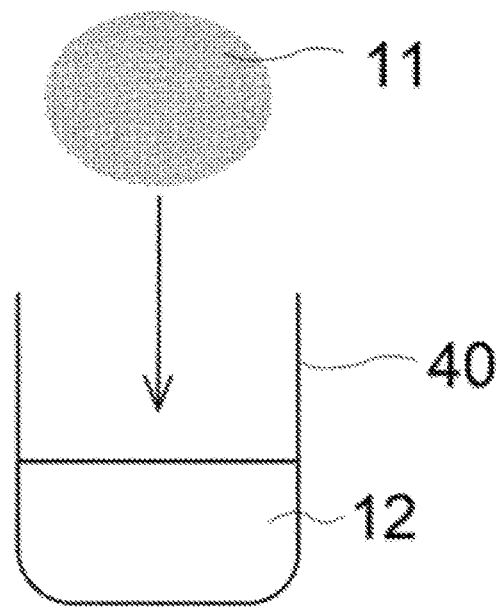
FIG. 4A is a schematic diagram showing the method for manufacturing a wavelength conversion member of embodiment 1.

As described above, the phosphor 11 irradiated with the plasma P is mixed with the liquid form resin member 12 to form the slurry 10A. For example, as shown in FIG. 4A, the liquid form resin member 12 and the phosphor 11 are input into a mixing container 40 having a stirring a function and stirred. At this time, in addition to the phosphor 11, it is possible to mix a dispersing agent, etc.

When stirring, it is preferable that the temperature be approximately 20° C. to 50° C. Also, for stirring, it is possible to use centrifugal stirring, vacuum centrifugal stirring, manual stirring, etc. In the case of centrifugal stirring, for example when there is approximately 150 ml of the slurry 10A, it is possible to have the rotation speed in the range of 400 rpm to 2000 rpm. Also, it is possible to have the stirring time in the range of 1 minute to 20 minutes.

As the liquid form resin member 12, it is possible to use a resin material of a two-liquid mixed type, a one-liquid type, etc. As the liquid form resin member 12, examples include silicone resin, modified silicone resin, epoxy resin, modified epoxy resin, acrylic resin, etc. It is also possible to use a silicone resin, an epoxy resin, a urea resin, a fluororesin, and a hybrid resin containing at least one of these resins, etc. The phosphor 11 can be mixed at approximately 5 mass % to 58 mass % with respect to the liquid form resin member 12.

(Step for Curing Slurry)

Figure 5A:
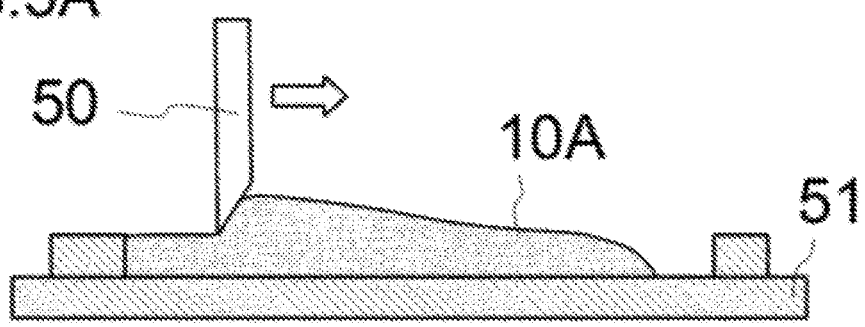
FIG. 5A is a schematic diagram showing the method for manufacturing a wavelength conversion member of embodiment 1.
Figure 5B:
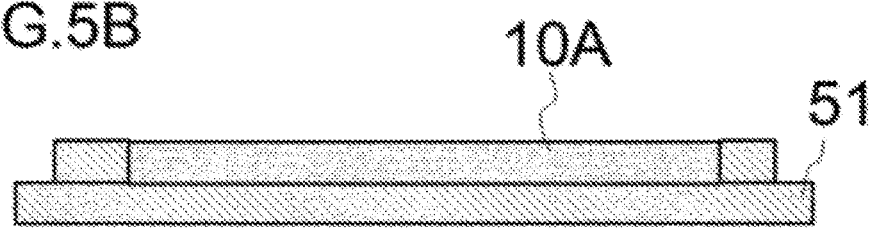
FIG. 5B is a schematic diagram showing the method for manufacturing a wavelength conversion member of embodiment 1.
Figure 5C:
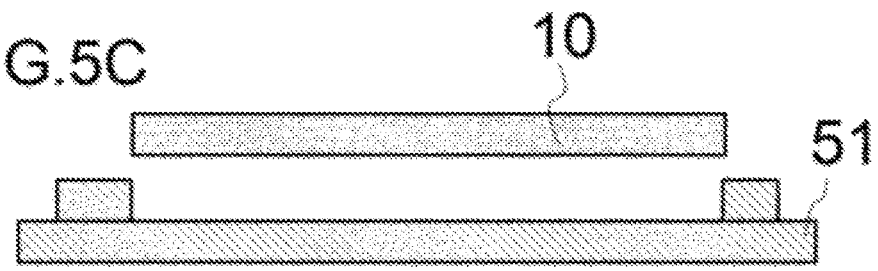
FIG. 5C is a schematic diagram showing the method for manufacturing a wavelength conversion member of embodiment 1.

The slurry 10A obtained as described above is applied on a support member 51 and cured as shown in FIG. 5A, for example. Here, a heat resistant sheet is used as the support member 51, and the slurry 10A is applied so as to be the desired thickness thereon using a squeegee 50. After that, by curing using heating, etc., it is possible to have a sheet form wavelength conversion member 10 like that shown in FIG. 1.

As the sheet form wavelength conversion member 10, it is possible to have thickness of 30 μm to 150 μm, for example. The sheet form wavelength conversion member 10 can have the same thickness overall, or can have one portion be thicker or thinner, etc. The size of the wavelength conversion member 10 is not particularly limited, and for example it is possible for the surface area to be approximately 50 $cm^2$ to 400 $cm^2$.

The planar view shape of the wavelength conversion member 10 is not particularly limited, and for example it is possible to be a polygon such as a square, a rectangle, a triangle, a hexagon, etc., a circle or an oval, and furthermore to be one of these shapes with a portion missing.

The wavelength conversion member 10 obtained as described above, for example when using KSF as the phosphor, is a volume of 97% to 99% with respect to the volume of the liquid form wavelength conversion member before curing, and there is little volume change before and after curing. This is considered to be because the surface of the phosphor particles is reformed by plasma irradiation to improve wettability with the resin member, and as a result, air is unlikely to mix in during mixing of the phosphor and the resin member.

Embodiment 2

Figure 6:
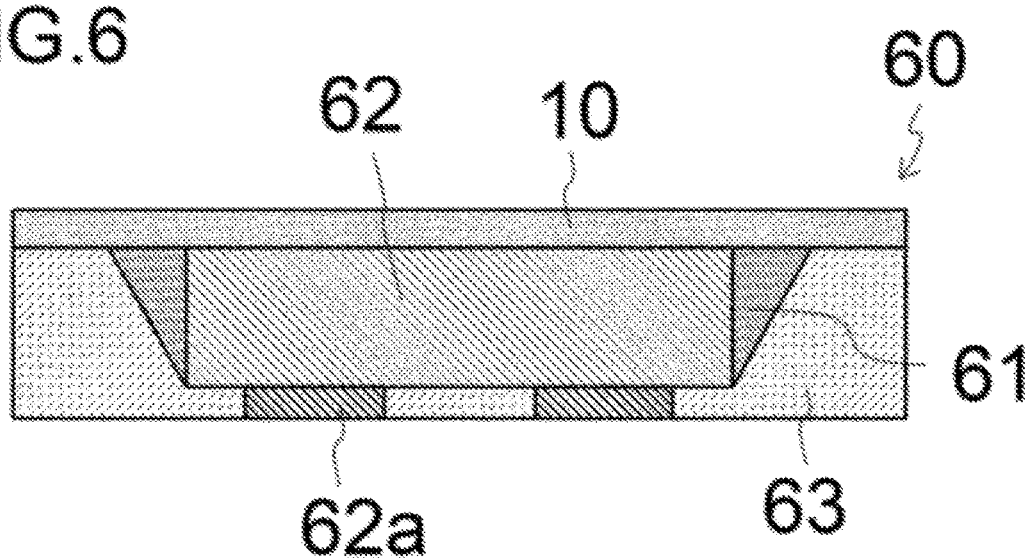
FIG. 6 is a schematic cross section view of a light emitting device obtained using the wavelength conversion member obtained with the method for manufacturing a wavelength conversion member of embodiment 1.

FIG. 6 is a schematic cross section view showing one example of a light emitting device 60 of embodiment 2, which uses the wavelength conversion member 10 obtained using the method for manufacturing a wavelength conversion member of embodiment 1. The light emitting device 60 comprises: a light emitting element 62 comprising an element electrode 62a; and the wavelength conversion member 10. The light emitting device 60 further comprises a light guide member 61 that joins the wavelength conversion member 10 and the light emitting element 62, and a covering member 63 that covers lateral sides of the light emitting element 62. This kind of light emitting device 60 can be obtained using the steps shown in FIG. 7A to FIG. 7F, for example.

Figure 7A:
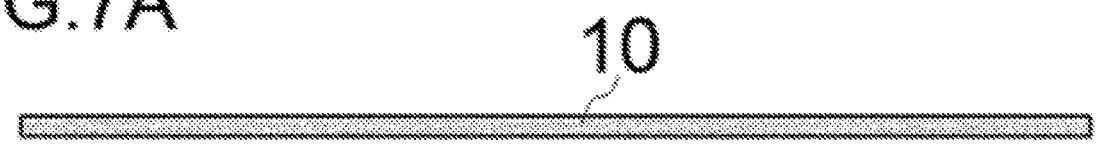
FIG. 7A is a schematic diagram showing the method for manufacturing a light emitting device of embodiment 2, which uses the wavelength conversion member obtained with the method for manufacturing a wavelength conversion member of embodiment 1.

First, as shown in FIG. 7A, the sheet form wavelength conversion member 10 formed using the method shown in embodiment 1 is prepared. Here, an already cured (formed) wavelength conversion member 10 is prepared. Also, here, an example is explained of the wavelength conversion member 10 of a size for which it is possible to form a plurality of light emitting devices.

As the light emitting element 62, it is possible to use a semiconductor light emitting element comprising a light emitting layer. As the semiconductor layer, it is possible to use an item that uses a nitride type semiconductor ($In_X Al_Y Ga_{1-X-Y}N$, $0 \leq X$, $0 \leq Y$, $X+Y \leq 1$) as the light emitting element of ultraviolet light, blue light, and green light, for example. For the electrodes of the light emitting element, a pair is placed on the same surface side of the semiconductor layer, or at least one pair is placed on opposing surfaces. This pair of electrodes may be ohmically connected so that the current-voltage characteristics are linear or approximately linear with the semiconductor layer in which they are provided. For the electrodes of the light emitting element, it is possible to use known materials in the concerned field. Examples include items that contain Au, Ag, Cu, etc.

Figure 7B:
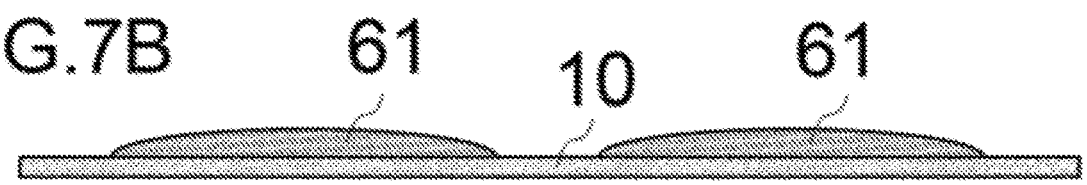
FIG. 7B is a schematic diagram showing the method for manufacturing a light emitting device of embodiment 2, which uses the wavelength conversion member obtained with the method for manufacturing a wavelength conversion member of embodiment 1.
Figure 7C:
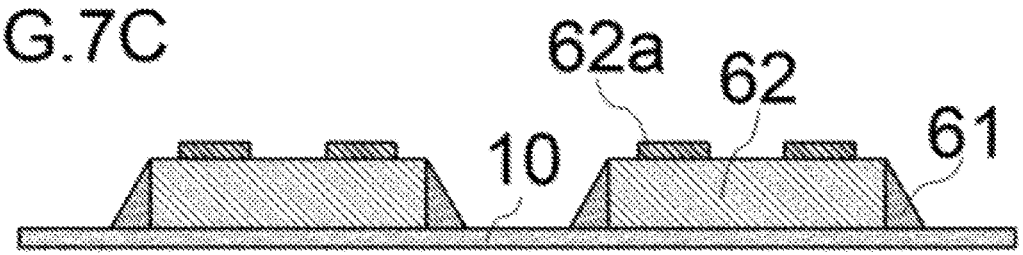
FIG. 7C is a schematic diagram showing the method for manufacturing a light emitting device of embodiment 2, which uses the wavelength conversion member obtained with the method for manufacturing a wavelength conversion member of embodiment 1.
Figure 7D:
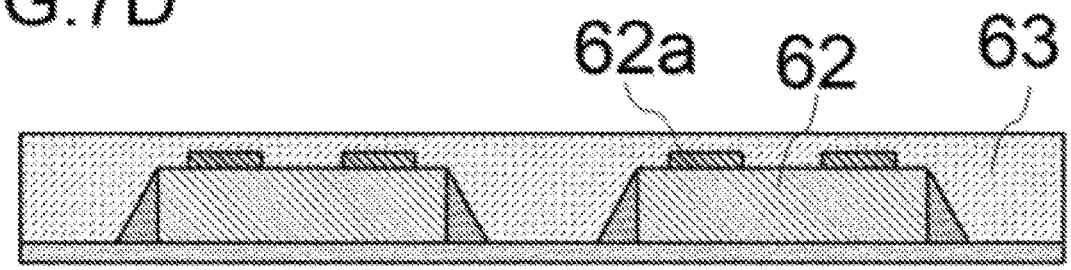
FIG. 7D is a schematic diagram showing the method for manufacturing a light emitting device of embodiment 2, which uses the wavelength conversion member obtained with the method for manufacturing a wavelength conversion member of embodiment 1.
Figure 7E:
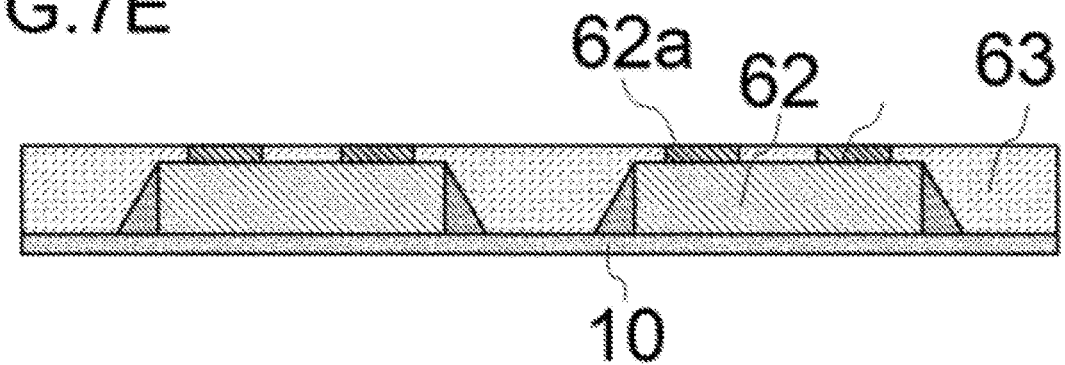
FIG. 7E is a schematic diagram showing the method for manufacturing a light emitting device of embodiment 2, which uses the wavelength conversion member obtained with the method for manufacturing a wavelength conversion member of embodiment 1.
Figure 7F:
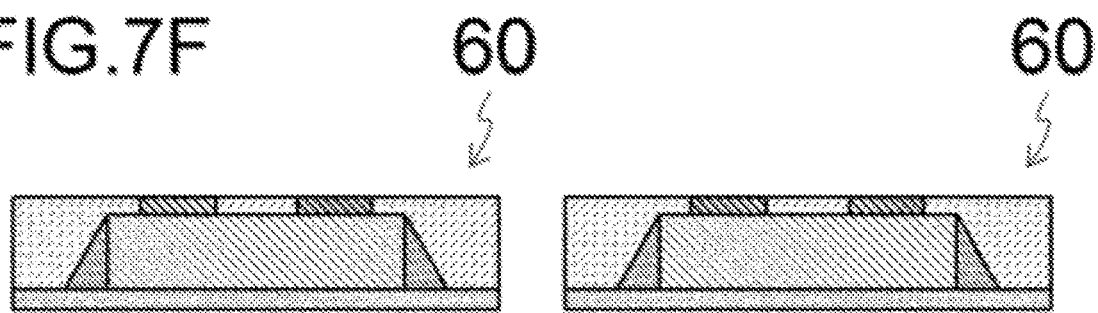
FIG. 7F is a schematic diagram showing the method for manufacturing a light emitting device of embodiment 2, which uses the wavelength conversion member obtained with the method for manufacturing a wavelength conversion member of embodiment 1.

Next, as shown in FIG. 7B, the light guide member 61 is placed on the wavelength conversion member 10. The light guide member 61 functions as an adhesive agent that adheres the wavelength conversion member 10 and the light emitting element 62. At this time, as shown in FIG. 7C, the light guide member 61 also creeps up the side surface of the light emitting element 62. Thereafter, as shown in FIG. 7D, the entire light emitting element 62 is covered by a light reflective covering member 63. Next, as shown in FIG. 7E, a portion of the covering member 63 is removed so that the element electrode 62a of the light emitting element 62 is exposed. When the covering member 63 is provided so that the element electrode 62a is exposed in advance, this step can be omitted. Next, as shown in FIG. 7F, by cutting the wavelength conversion member 10 and the covering member 63, it is possible to obtain the light emitting device 60 shown in FIG. 6. As the light guide member 61, it is possible to use silicone resin, for example. As the covering member 63, it is possible to silicone resin containing titanium oxide as a reflective member, for example.

By using the wavelength conversion member 10 of embodiment 1, when designing the thickness of the wavelength conversion member 10, for example, it is possible to reduce the effort for considering the volume reduction rate when curing. For that reason, adjusting the chromaticity of the light emitting device becomes easy.

Embodiment 3

Figure 8:
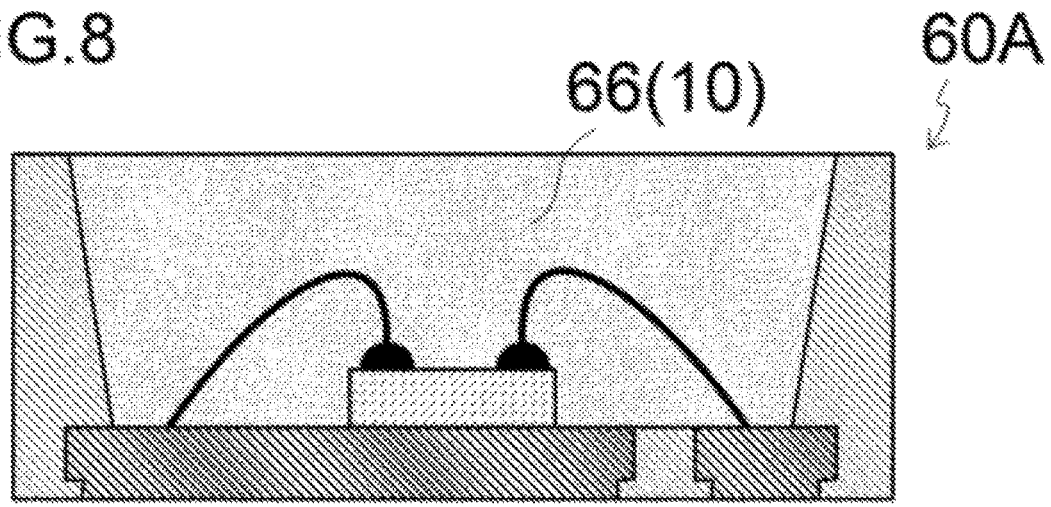
FIG. 8 is a schematic cross section view of the light emitting device obtained with the method for manufacturing the light emitting device of embodiment 3.

FIG. 8 shows the light emitting device 60A obtained using the method for manufacturing a light emitting device of embodiment 3. In contrast to forming the light emitting device using the wavelength conversion member formed in advance with embodiment 2, the point that is different with embodiment 3 from embodiment 2 is comprising the step of curing the wavelength conversion member within the step for manufacturing the light emitting device using the slurry that is the wavelength conversion member before curing.

Figure 9A:
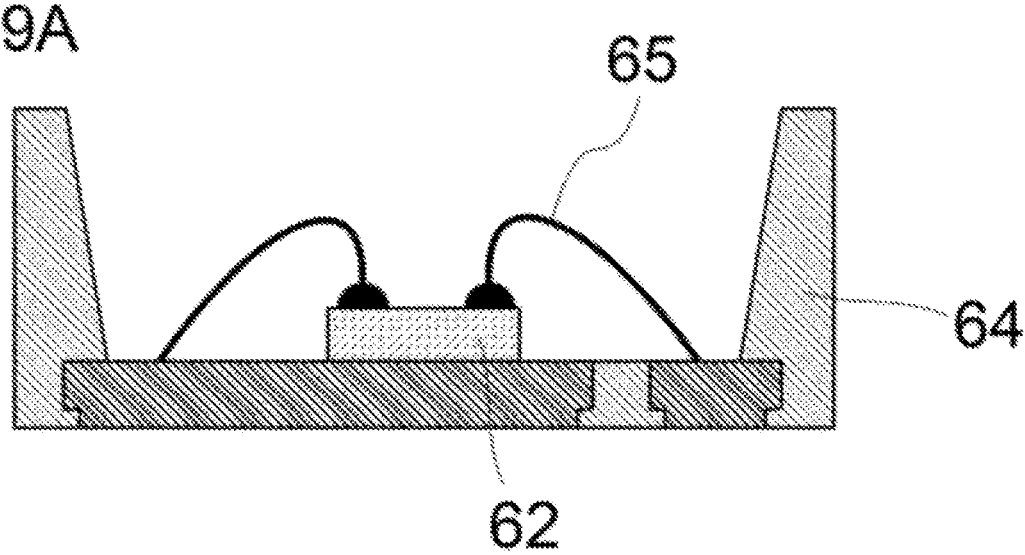
FIG. 9A is a schematic diagram showing the method for manufacturing the light emitting device of embodiment 3.
Figure 9B:
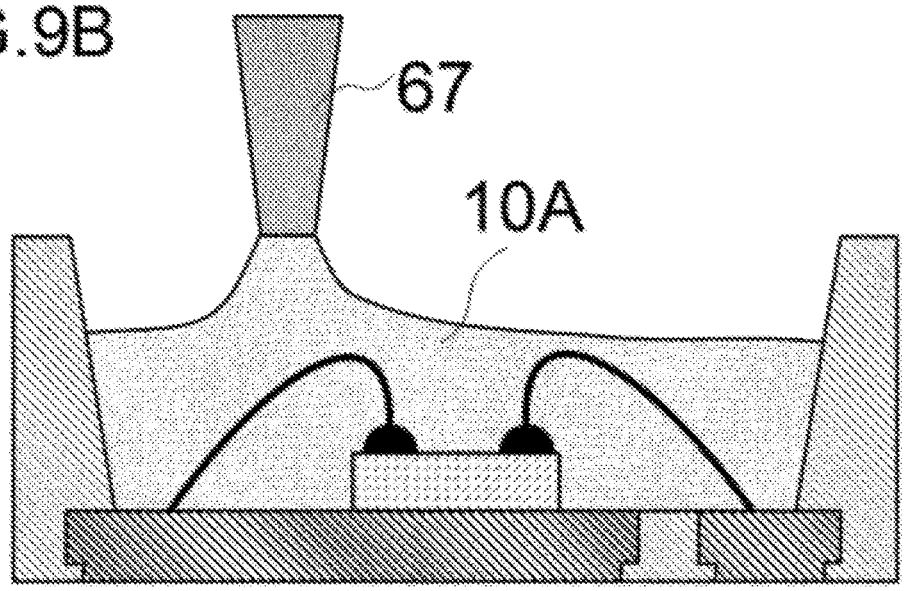
FIG. 9B is a schematic diagram showing the method for manufacturing the light emitting device of embodiment 3.

As shown in FIG. 9A, an intermediate body is prepared that electrically connects a support member 64 comprising a recess and the light emitting element 62 placed on the bottom surface of the recess using a wire 65. It is also possible to have the intermediate body that joins the electrode of the light emitting element 62 and the wiring of the support member 64 using an electrically conductive joining member without using the wire 65. The intermediate body can also further comprise a protective element such as a Zener diode, etc. Examples of the support member 64 include a resin package comprising a lead frame and a forming resin, a ceramic package comprising wiring and ceramic, a glass epoxy package comprising wiring and glass epoxy resin, a flexible package comprising a flexible resin sheet and wiring, etc. These support members, in addition to comprising the recess such as shown in FIG. 9B, for example, can also be a flat plate shape. Also, when placing the slurry, it is also possible to cover together with the light emitting element. The size and shape of the support member, the number and size of the placed light emitting elements, the light emission wavelength, etc., can be selected as appropriate according to the purpose and application.

Figure 4B:
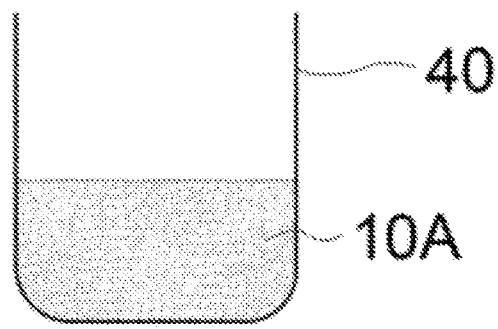
FIG. 4B is a schematic diagram showing the method for manufacturing a wavelength conversion member of embodiment 1.

As shown in FIG. 4B, the slurry 10A for which the phosphor 11 irradiated by plasma and the resin member 12 are mixed is prepared. As shown in FIG. 9B, this slurry 10A is supplied inside the recess of the support member 64. As the method for supplying the slurry 10A, examples include the method of potting using the dispensing nozzle 67 as shown in FIG. 9B, spraying, printing, etc. Thereafter, using heating, etc., the slurry 10A is cured in a state in which the light emitting element 62, etc., is encased. By doing this, it is possible to form a sealing member 66 that seals the light emitting element 62 and the wire 65, etc.

The wavelength conversion member 10 (sealing member 66) that configures a portion of the light emitting device 60A obtained as described above has a volume of 97% to 99% with respect to the volume of the liquid form wavelength conversion member 10A before curing, and there is little volume change before and after curing. By doing this, in the top surface of the recess, it is possible to have the sealing member 66 have little shrinkage as shown in FIG. 8.

When curing the sealing member 66, if the volume reduction rate is large, after curing, there is a possibility of the wire and the light emitting element being exposed from the sealing member 66. Using the method for manufacturing a light emitting device of this embodiment, it is possible to suppress the sealing member 66 from significantly shrinking, and possible to suppress the wire, etc., from being exposed.

INDUSTRIAL APPLICABILITY

The method for manufacturing the semiconductor device of the embodiments of the present disclosure can be used for semiconductor devices used in a wide range of applications.

EXPLANATION OF CODES

Wavelength conversion member 10; Phosphor (after plasma irradiation) 11; Phosphor 11A (before plasma irradiation); Resin member 12; Holding member 20; Column 30; Atmospheric pressure plasma processing device 31; Pedestal 32; Plasma P; Mixing container 40; Slurry 10A; Squeegee 50; Support 51; Light emitting device 60, 60A; Light guide member 61; Light emitting element 62; Element electrode 62a; Covering member 63; Support 64; Wire 65; Sealing member 66 (wavelength conversion member); and Nozzle 67.

What is claimed is:

1. A method for manufacturing a wavelength conversion member, comprising:
    irradiating plasma on surfaces of phosphor particles while the phosphor particles are housed in a holding member including a filter defining openings, with each of the openings being smaller than an average particle size of the phosphor particles;
    mixing the phosphor particles irradiated by plasma and a liquid form resin member to form a slurry; and
    curing the slurry, wherein
    the irradiating of the plasma includes irradiating the plasma from a front surface side of the holding member and irradiating the plasma from a back surface side of the holding member, the holding member including the filter on a front surface and a back surface.

2. The method for manufacturing a wavelength conversion member of claim 1, wherein
    the irradiating of the plasma includes irradiating the plasma using air, nitrogen gas, or a fluorine-containing gas as a carrier gas.

3. The method for manufacturing a wavelength conversion member of claim 1, wherein
    the phosphor contains at least one of KSF, YAG, and LAG.

4. The method for manufacturing a wavelength conversion member of claim 1, wherein
    the mixing of the phosphor particles and the liquid form resin member includes mixing the phosphor particles and the liquid form resin member so that the phosphor particles are 5 mass % to 58 mass % with respect to the liquid form resin member.

5. The method for manufacturing a wavelength conversion member of claim 1, wherein
    the curing of the slurry includes forming the slurry so that the wavelength conversion member has a sheet shape having a thickness of 30 µm to 150 µm.

6. A method for manufacturing a wavelength conversion member comprising
    irradiating plasma on surfaces of phosphor particles;
    mixing the phosphor particles irradiated by plasma and a liquid form resin member to form a slurry; and
    curing the slurry, the slurry being formed so that the wavelength conversion member has a sheet shape having a thickness of 30 µm to 150 µm.

7. The method for manufacturing a wavelength conversion member of claim 6, wherein
    the irradiating of the plasma includes irradiating the plasma using air, nitrogen gas, or a fluorine-containing gas as a carrier gas.

8. The method for manufacturing a wavelength conversion member of claim 6, wherein
    the phosphor contains at least one of KSF, YAG, and LAG.

9. The method for manufacturing a wavelength conversion member of claim 6, wherein
    the mixing of the phosphor particles and the liquid form resin member includes mixing the phosphor particles and the liquid form resin member so that the phosphor particles are 5 mass % to 58 mass % with respect to the liquid form resin member.

10. A method for manufacturing a light emitting device, comprising:
    irradiating plasma on surfaces of phosphor particles while the phosphor particles are housed in a holding member including a filter defining openings, with each of the openings being smaller than an average particle size of the phosphor particles;
    mixing the phosphor particles irradiated by plasma and a liquid form resin to form a slurry;
    preparing a light emitting element placed on a support member;
    placing the slurry to cover the light emitting element; and
    curing the slurry after the placing of the slurry to cover the light emitting element, wherein
    the irradiating of the plasma includes irradiating the plasma from a front surface side of the holding member and irradiating the plasma from a back surface side of the holding member, the holding member including the filter on a front surface and a back surface.

11. The method for manufacturing a light emitting device of claim 10, wherein
    the irradiating of the plasma includes irradiating the plasma using air, nitrogen gas, or a fluorine-containing gas as a carrier gas.

12. The method for manufacturing a light emitting device of claim 10, wherein
    the phosphor contains at least one of KSF, YAG, and LAG.

13. The method for manufacturing a light emitting device of claim 10, wherein
    the mixing of the phosphor particles and the liquid form resin member includes mixing the phosphor particles and the liquid form resin member so that the phosphor particles are 5 mass % to 58 mass % with respect to the liquid form resin member.

* * * * *